United States Patent
Ieda et al.

(10) Patent No.: US 7,598,753 B2
(45) Date of Patent: Oct. 6, 2009

(54) HUMAN BODY DETECTING DEVICE FOR VEHICLES

(75) Inventors: Kiyokazu Ieda, Chiryu (JP); Takeshi Ito, Chiryu (JP); Takamasa Fujitsuna, Anjo (JP); Noriyasu Onishi, Aichi (JP); Teruya Tomiyasu, Toyota (JP)

(73) Assignees: Aisin Seiki Kabushiki Kaisha, Kariya-Shi, Aichi (JP); Toyota Jidosha Kabushiki Kaisha, Toyota-Shi, Aichi-Ken (JP)

( * ) Notice: Subject to any disclaimer, the term of this patent is extended or adjusted under 35 U.S.C. 154(b) by 31 days.

(21) Appl. No.: 10/576,968

(22) PCT Filed: Oct. 28, 2004

(86) PCT No.: PCT/JP2004/016384

§ 371 (c)(1),
(2), (4) Date: Oct. 25, 2006

(87) PCT Pub. No.: WO2005/041130

PCT Pub. Date: May 6, 2005

(65) Prior Publication Data

US 2007/0096905 A1    May 3, 2007

(30) Foreign Application Priority Data

Oct. 29, 2003    (JP)    .............................. 2003-368549

(51) Int. Cl.
*G01R 27/26*    (2006.01)

(52) U.S. Cl. ...................... 324/658; 340/540; 340/5.72; 340/426.28; 324/686; 70/237

(58) Field of Classification Search .................. 324/658
See application file for complete search history.

(56) References Cited

U.S. PATENT DOCUMENTS

| 3,689,814 | A |   | 9/1972 | Holt |
| 5,446,391 | A |   | 8/1995 | Aoki et al. |
| 5,526,294 | A |   | 6/1996 | Ono et al. |
| 6,075,294 | A | * | 6/2000 | Van den Boom et al. ... 307/10.1 |
| 6,373,265 | B1 | * | 4/2002 | Morimoto et al. ........... 324/686 |

(Continued)

FOREIGN PATENT DOCUMENTS

EP    1 324 364 A2    7/2003

(Continued)

OTHER PUBLICATIONS

Partial English language translation of Japanese Office Action.

(Continued)

*Primary Examiner*—Timothy J Dole
*Assistant Examiner*—Benjamin M Baldridge
(74) *Attorney, Agent, or Firm*—Buchanan Ingersoll & Rooney PC

(57) ABSTRACT

A human body detecting device for a vehicle includes a sensor electrode provided in a door handle arranged on outside of a vehicle door, the sensor electrode changing the electrostatic capacitance in response to an approach of human body and a determining circuit for judging whether a human body approaches or not based on the change of the electrostatic capacitance of the sensor electrode. The human body detecting device further includes an auxiliary electrode coupled capacitance-wise with the sensor electrode.

19 Claims, 5 Drawing Sheets

U.S. PATENT DOCUMENTS

| | | |
|---|---|---|
| 6,768,413 B1 | 7/2004 | Kemmann et al. |
| 6,847,289 B2 * | 1/2005 | Pang et al. .............. 340/426.28 |
| 6,871,887 B2 * | 3/2005 | Jooss et al. .............. 292/336.3 |
| 6,998,968 B2 * | 2/2006 | Garnault et al. ........ 340/426.28 |
| 7,091,823 B2 * | 8/2006 | Ieda et al. .................. 340/5.72 |
| 2002/0121146 A1 * | 9/2002 | Manaresi et al. ......... 73/862.68 |
| 2003/0107473 A1 * | 6/2003 | Pang et al. ................. 340/5.72 |
| 2003/0128116 A1 | 7/2003 | Ieda et al. |
| 2004/0046449 A1 | 3/2004 | Eidesheim et al. |
| 2004/0066294 A1 * | 4/2004 | Ieda et al. ................ 340/545.7 |
| 2007/0182166 A1 * | 8/2007 | Schindler et al. ......... 292/336.3 |

FOREIGN PATENT DOCUMENTS

| | | |
|---|---|---|
| EP | 1 384 845 A1 | 1/2004 |
| EP | 1 394 946 A2 | 3/2004 |
| FR | 2 817 663 A1 | 6/2002 |
| JP | 61-205888 A | 9/1986 |
| JP | 2-27637 B2 | 6/1990 |
| JP | 5-297149 (A) | 11/1993 |
| JP | 2001-520337 A | 10/2001 |
| JP | 2002-257508 A | 9/2002 |

OTHER PUBLICATIONS

Form PCT/ISA/210 (International Search Report) dated Apr. 26, 2005.
Form PCT/ISA/237 (Written Opinion of the International Searching Authority) dated Apr. 26, 2005.
Form PCT/IPEA/408 (Written Opinion of the International Preliminary Examining Authority) dated Dec. 7, 2005.
Form PCT/IPEA/409 (International Preliminary Report on Patentability) dated Jan. 27, 2006.

* cited by examiner

HUMAN BODY DETECTING DEVICE FOR VEHICLES

TECHNICAL FIELD

This invention generally relates to a human body detecting device. More particularly, this invention pertains to a human body detecting device provided with a determining circuit for determining the approach of human body based on the change of electrostatic capacitance of a sensor electrode provided in a door handle arranged on outside of a vehicle door.

BACKGROUND ART

The human body detecting device for the vehicles in this field is used in a system which controls opening and closing operations of a door of a vehicle, such as an automobile for detecting a human body approaching the vehicle. The system for opening and closing operations of a door detects a human body and automatically unlocks the vehicle door when the driver or the owner of the vehicle approaches the vehicle with an electronic key or card which can identify the driver or the owner. The system also locks the door when the driver or the owner of the vehicle gets off and operates a switch provided in the door handle.

One of a known human body detecting device of the type is shown in a publication (U.S. Pat. No. 6,075,294), in which the device uses an electrostatic capacitance of equivalent parallel flat plate electrodes between a sensor electrode provided in the door handle and a vehicle body (mostly the exterior panel of the door) and detects the change of the electrostatic capacitance occurring when an object having electromagnetic property (such as dielectric constant) different from that of the air, such as a human hand, is inserted between the door handle and the door exterior panel. This mechanism is used as a touch sensor or a switch element.

The principle of using electrostatic capacitance of equivalent parallel flat plate electrodes used as a touch sensor is known for example from JP 02-27637B2. Also known is a detection of the electrostatic capacitance change by a single conductive body, in place of a pair of parallel flat plate electrodes, used as a touch sensor. This method is shown in U.S. Pat. No. 3,689,814.

These known arts are not sufficient to achieve accurate detection operation because of unfavorable conditions in which a sensor electrode is placed in and which arise from the fact that the electrode is located within a door handle. Specifically, there tend to be a large variation in relevant parameters, such as the distance between a human body and the sensor electrode in the handle, and a direction in which the human body approaches the electrode, depending on how the human body approaches the door handle. Also, the electrostatic capacitance of the sensor electrode may change due to entering of water into the inside of door handle. In order to avoid such entering of water, a waterproof means such as sealing agent can be provided to the door handle. However, this will lead to an increased complexity of the device and will render the device less suitable for mass production. Further, there is also a problem of available space in the door handle.

DISCLOSURE OF INVENTION

In considerations of such problems in the conventional devices, the object of the present invention is to provide a human body detecting device for vehicles that has a relatively simple structure. Another object of the present invention is to provide such device that does not require a large space. A further object of the invention is to provide such a device that can accurately detect a human body even under relatively poor environmental conditions.

To achieve at least one of the stated objects, the human body detecting device in accordance with the present invention comprises a sensor electrode provided in a door handle arranged on outside of a vehicle door, the sensor electrode changing the electrostatic capacitance in response to an approach of a human body and a determining circuit signally connected with the sensor electrode for determining an approach of a human body based on the change of the electrostatic capacitance of the sensor electrode, characterized in that an auxiliary electrode, that is coupled capacitance-wise but substantially electrically not connected with the sensor electrode, is provided in the door handle in the vicinity of the sensor electrode.

According to above structure, since the space in the door handle is very limited, the coupled capacitance between the sensor electrode and the auxiliary electrode is relatively small compared to the human body capacitance. When the human body electrostatic capacitance is coupled in series to the coupled capacitance between the auxiliary electrode and the sensor electrode, the electrostatic capacitance between the auxiliary electrode and the sensor electrode is the main contributor to the measured capacitance. Accordingly, even when the human body approaches in variety of ways toward the sensor electrode, with the human body electrostatic capacitance connected to the sensor electrode through the coupled capacitance between the auxiliary electrode and the sensor electrode, the variance in the capacitance change due to an approaching human body is smaller than when the human body capacitance is directly coupled to the sensor electrode.

Further, since the auxiliary electrode is located close to the sensor electrode, the coupled capacitance is stable and not so much change occurs. This can reduce the change of the capacitance of the sensor electrode caused by an object other than the human body. For example, even if water enters into the door handle in the vicinity of the sensor electrode, since the auxiliary electrode, that is electrically substantially not connected with the sensor electrode, is positioned near the sensor electrode and is in capacitance-wise coupled with the sensor electrode, the change in the sensed capacitance is reduced, thus reducing the effect caused by water.

Since the auxiliary electrode, that is electrically substantially not connected with the sensor electrode, is provided in the door handle at the vicinity of the sensor electrode, the structure is simple and no large installation space is required.

Therefore, the present invention can provide an improved human body detecting device for vehicle that does not require a large space, that is simple in structure, and that affords an improved detection capability under unfavorable environmental conditions.

According to one aspect of the present invention, the sensor electrode is positioned opposite an outer panel of the vehicle door and the auxiliary electrode is positioned between the sensor electrode and the outer panel of the vehicle door.

This can ensure a reliable detection of a human approach as a hand is inserted between the door handle and the outer panel of the door when door is opened.

According to further aspect of the invention, the human body detecting device includes the auxiliary electrode provided at a plurality of locations in the door handle.

When a human hand approaches a portion of the door handle, the human body capacitance is coupled to the sensor electrode via the auxiliary electrode provided at various locations of the door handle which results in a change in the sensed capacitance. This helps ensure reliable detection of the human body.

The auxiliary electrode may be formed by conductive plate, conductive resin or conductive paint. That is, suitable material for the auxiliary electrode may be chosen according to various needs.

According to still further aspect of the invention, the auxiliary electrode is provided to at least one of a core member of the door handle, an inner wall of the door handle and an outer surface of the door handle.

The auxiliary electrode can be provided at various portions such as at the core member of the door handle or at the inner wall of the door handle according to the shape and the structure of the door handle.

BRIEF DESCRIPTION OF THE DRAWINGS

The foregoing and additional features and characteristics of the present invention will become more apparent from the following detailed description considered with reference to the accompanying drawings, wherein.

MODES FOR CARRYING OUT THE INVENTION

Figure 1:
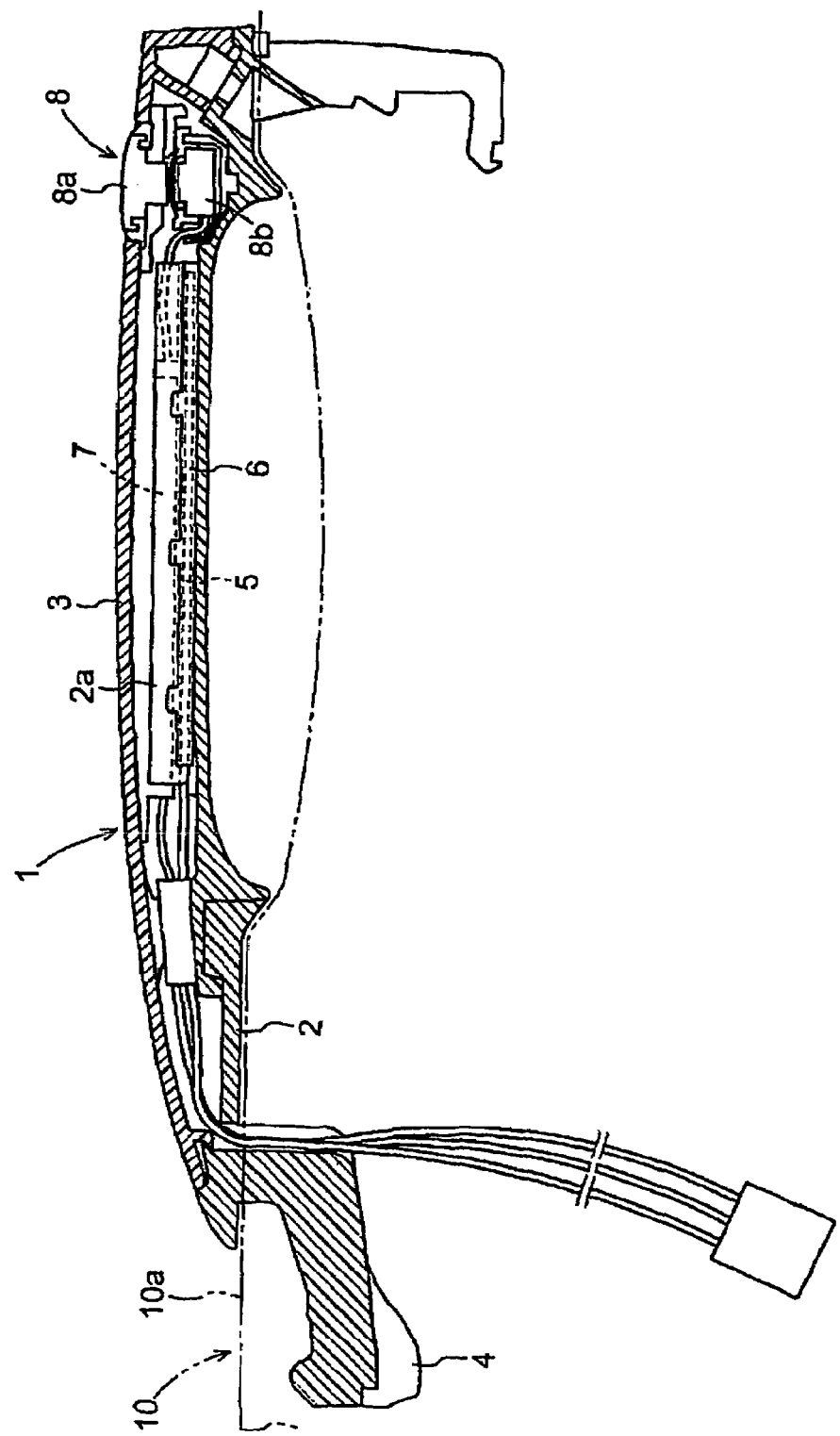
FIG. 1 shows a plane sectional view of a door handle installed with a human body detecting device according to the present invention.
Figure 2:
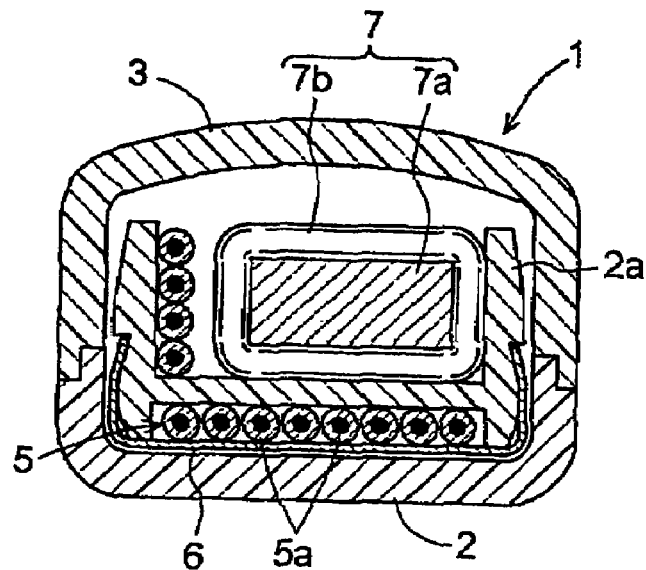
FIG. 2 is a cross sectional view of the door handle illustrated in FIG. 1.

The human body detecting device for a vehicle according to the invention will be explained with reference to the attached drawings. As shown in FIGS. 1 and 2, a door handle 1 arranged outside of a vehicle door 10 includes, among other things, a handle body 2 having one arm 4 at vehicle front side and a handle cover 3 for covering the handle body 2. These handle body 2 and handle cover 3 are made of synthetic resin material.

A sensor electrode 5 is provided in the door handle 1. The electrostatic capacitance of the sensor electrode 5 changes as a human approaches. An auxiliary electrode 6 is also provided in the door handle 1 near the sensor electrode 5. The auxiliary electrode 6 is coupled capacitance-wise with but substantially electrically not connected with the sensor electrode 5. The term "substantially electrically not connected" means that there is no substantial flow of charged particles such as electrons between the relevant parts. More specifically, both the sensor electrode 5 and the auxiliary electrode 6 are provided in a space defined by the handle body 2 and handle cover 3.

Figure 3:
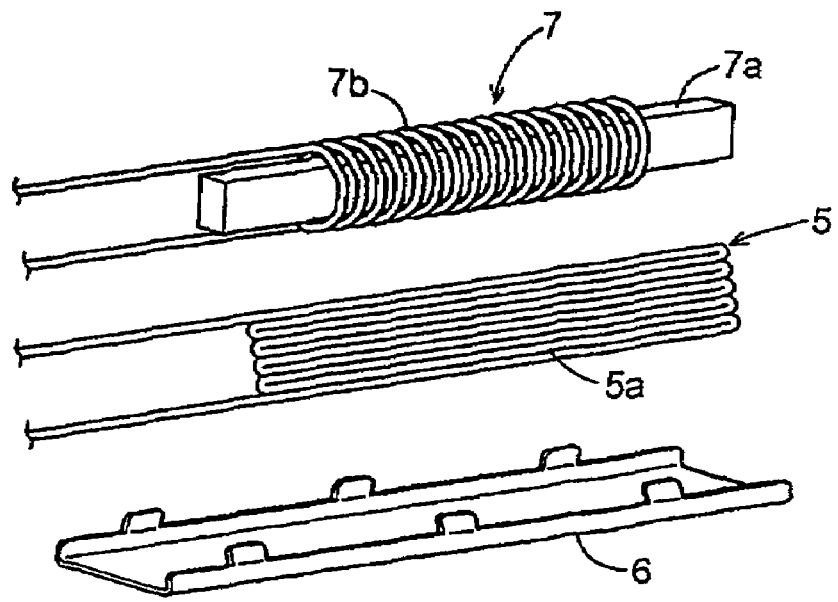
FIG. 3 is a perspective view of a sensor electrode and an auxiliary electrode according to the present invention.

The sensor electrode 5 is generally of long sheet shape and located opposite a door outer panel 10a of the vehicle door 10. The sensor electrode 5 and the outer panel 10a together form an electrostatic capacitor of a parallel flat plate type. As shown in FIG. 3, the sensor electrode 5 is formed as a wiring harness with a long conducting and insulated wire 5a folded back and forth a number of times to form a parallel overlap portion extending along the longitudinal direction of vehicle. The wire 5a does not need to be insulated to form the electrode 5.

Figure 4:
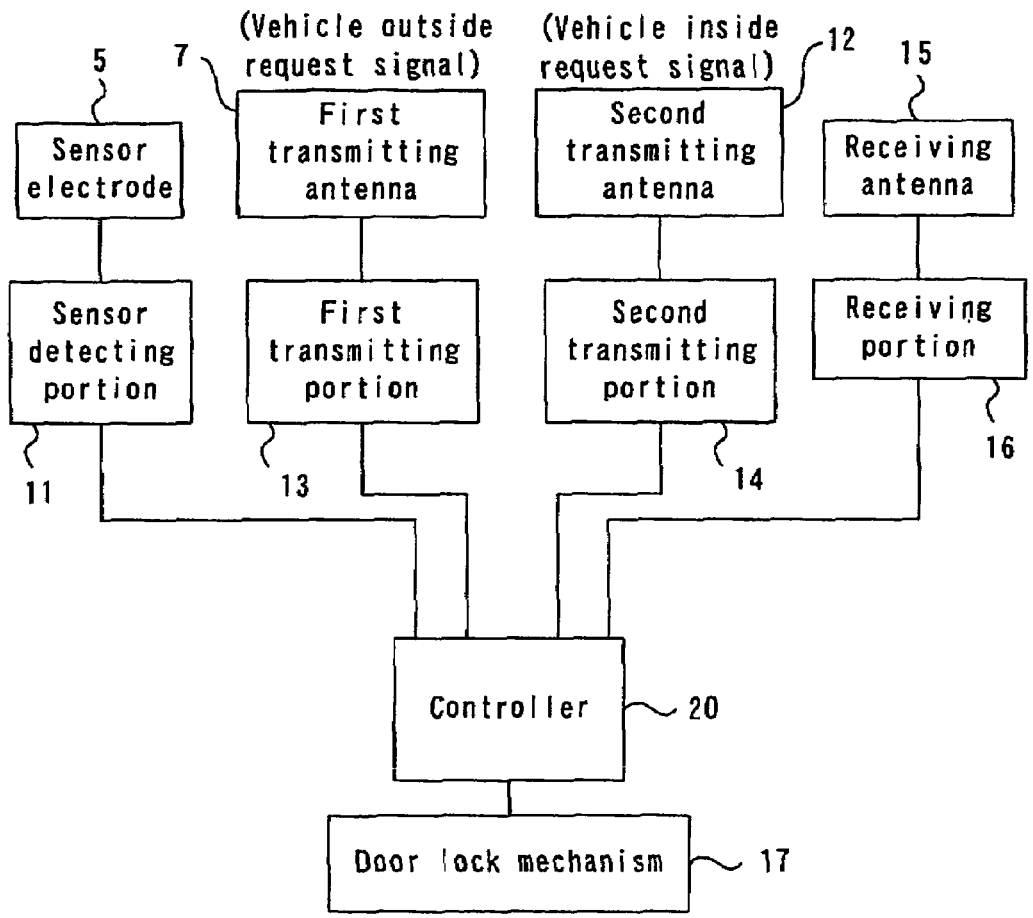
FIG. 4 shows a control circuit of a door lock system at a vehicle side.

As shown in FIGS. 2 and 4, the auxiliary electrode 6 is formed by a long conductive sheet plate with an approximately bracket-shaped cross section and is attached to a core member 2a of the door handle 1 supported by the handle body 2. The core member 2a has a generally H-shaped cross section with two generally parallel leg portions and a cross member connecting the two leg portions as shown in FIG. 2. The sensor electrode 5 is located on a side of the cross member facing the door outer panel 10a. The auxiliary electrode 6 is positioned between the sensor electrode 5 and the door outer panel 10a of the door 10

A first transmitting antenna 7 and a door lock switch 8 are accommodated in the space defined by the handle body 2 and the handle cover 3 as shown in FIG. 1. The wiring for the lock switch extends along the inside face of one of the leg portions of the core member 2a (as shown in FIG. 2) toward the arm 4 of the handle body 2 and extends to outside the handle body through a hole near the arm 4 as shown in FIG. 1. The first transmitting antenna 7 is formed as a loop antenna shape with—a conducting wire 7b wound around a rectangular parallelepiped ferrite core 7a. The door lock switch 8 includes a push button 8a and detecting portion 8b.

Figure 5:
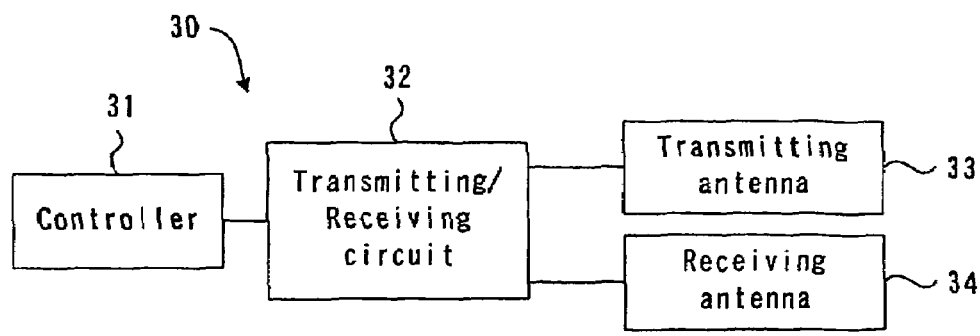
FIG. 5 shows the door lock system circuit at a remote controller circuit side.

The control structure is explained hereinafter. FIG. 4 shows a vehicle-side control circuit of a door lock system of a vehicle installed with the human body detecting device according to the present invention. FIG. 5 shows a control circuit of a remote controller 30 carried by a vehicle operator.

The control circuit at vehicle side includes a sensor detecting portion 11 signally connected with the sensor electrode 5 for processing a detection signal (change in electrostatic capacitance) from the sensor electrode 5. The output from the sensor detecting portion 11 is transmitted to input of a controller 20, which may be located anywhere in the vehicle. This sensor detecting portion 11 forms a determining circuit for determining approach of a human body based on the electrostatic capacitance change of the sensor electrode 5.

The vehicle side control circuit includes the first transmitting antenna 7 and a second transmitting antenna 12 that communicate with the remote controller 30, and a first transmitting portion 13 and a second transmitting portion 14 that supply transmitting signals (vehicle outside request signal and vehicle inside request signal) to the first and second transmitting antennas. The controller 20 drives the first and second transmitting portions 13 and 14. Further the vehicle side control circuit includes a receiving antenna 15 for receiving ID information signal transmitted by the remote controller 30 and a receiving portion 16 for demodulating the ID information signal. The output from the receiving portion 16 is transmitted to the controller 20 to identify the ID information.

A drive signal is outputted from the controller 20 for locking or unlocking all doors of the vehicle by door lock mechanism 17. The controller 20 controls the opening or closing operation of the door lock mechanism 17 based on the output signal (human body approach signal), from the detecting portion 11 and output signal (ID identifying signal) from the receiving portion 16.

On the other hand, the remote controller 30 (Detail in FIG. 5) includes a transmitting antenna 33 for transmitting the ID information signal to the vehicle side control circuit, a receiving antenna 34 for receiving the vehicle inside and outside request signals transmitted from the vehicle side, a transmitting/receiving circuit 32 for modulating or demodulating the signals from the antennas 33 and 34, and a controller 31. The vehicle outside and inside request signals received by the receiving antenna 34 are demodulated at the transmitting/receiving circuit 32 and transmitted to the controller 31. In response to these signals the controller 31 outputs ID information signal to the transmitting/receiving circuit 32. The ID information signal is modulated at the transmitting/receiving circuit 32 and then transmitted to the vehicle side from the transmitting antenna 33.

Figure 6A:
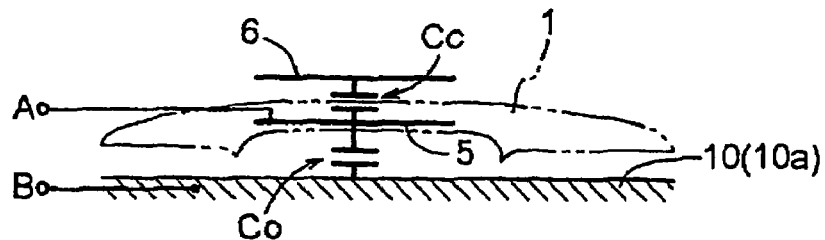
FIGS. 6a and 6b show an equivalent circuit showing an operation of the human body detecting device according to the present invention.
Figure 6B:
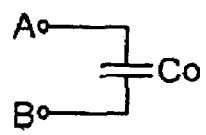

The detection of the electrostatic capacitance change in the sensor electrode 5 and the auxiliary electrode 6 will be explained hereinafter. FIGS. 6a and 6b show an equivalent circuit when there is no human body near by. The electrostatic capacitance C detected with no human body near by is a total capacitance Co of the capacitance between sensor electrode 5 and the vehicle body (mainly the outer panel 10a of the door 10) and the capacitance between the sensor electrode 5 and the transmitting antenna 7 (see FIG. 1) or the wire for the lock switch 8 (see FIG. 1) (i.e., C=Co). At this time, the coupled capacitance Cc between the auxiliary electrode 6 and the sensor electrode 5 does not contribute to the detected capacitance C since no human body or other object exists near the auxiliary electrode 6. In FIGS. 6a, 6b, 7a and 7b, the symbols A and B indicate output terminals of the sensor electrode.

Figure 7A:
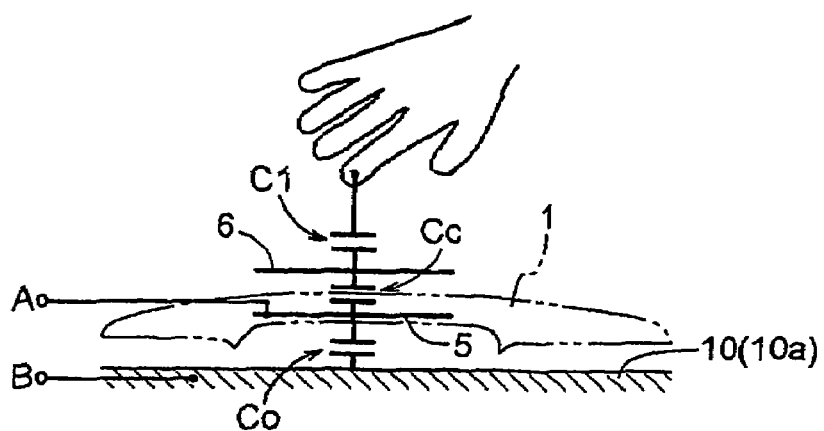
FIGS. 7a and 7b show an equivalent circuit showing an operation of the human body detecting device according to the present invention but showing a different condition operation from that of FIG. 6.
Figure 7B:
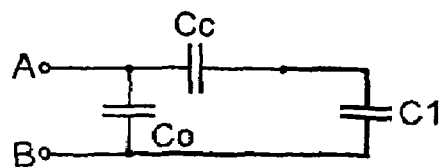

FIGS. 7a and 7b show an equivalent circuit when human body is near or is touching the handle. Although the figure depicts the hand to be located away from the handle for ease of understanding of the equivalent circuit, in actuality, the fingers are assumed to be curled to hold the handle 1 so that the fingers are between the door handle 1 and the outer door panel 10a; therefore, the fingers are closer to the auxiliary electrode 6 than the sensor electrode 5. Coupling between the human hand and the outer door panel 10a and coupling between the auxiliary electrode 6 and the outer door panel 10a are neglected as being small compared with other relevant parameters. Under this condition, the detected capacitance C is the total capacitance of the capacitance Co with no human body near by and the combined capacitance C1Cc/(C1+Cc) which is the combined capacitance of the coupled capacitance Cc between the auxiliary electrode 6 and the sensor electrode 5 on the one hand and the human body capacitance C1 on the other hand in series. In other words, the change (increase) $\Delta C$ in the detected capacitance C equals C1Cc/(C1+Cc) and the detected capacitance is C=C1Cc/(C1+Cc)+Co.

The human body capacitance C1 is generally around 150 pF, while the coupled capacitance Cc between the auxiliary electrode 6 and the sensor electrode 5 is one tenth to one hundredth of the human body capacitance C1 because of its limited space in the door handle. (That is, we have Cc<C1 or Cc<<C1). When this relationship (Cc<<C1) is applied to the above equation, we have approximate relationships C=Cc+Co, and $\Delta C$=Cc. Therefore, the capacitance change $\Delta C$ of the electrostatic capacitance C when human body is present is determined substantially by the coupled capacitance Cc between auxiliary electrode 6 and the sensor electrode 5 and the value of human body capacitance C1 does not substantially contribute to the change. Thus variations in the capacitance change $\Delta C$ of the sensor electrode 5 can be reduced even with a large variation in how human body approaches. The coupled capacitance Cc between the auxiliary electrode 6 and the sensor electrode 5 does not change very much even if some other object exists near by since the auxiliary electrode 6 is positioned close to the sensor electrode 5. This has an added benefit of reducing the change in the electrostatic capacitance C of the sensor electrode 5 when detecting objects other than human body.

Figure 8:
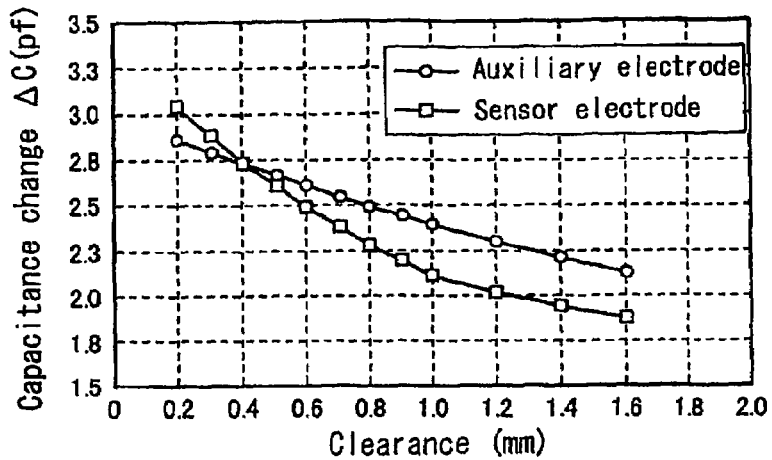
FIG. 8 shows a graph indicating the effects of the human body detecting device according to the present invention.

FIG. 8 shows one result of a calculation to show the effectiveness of the auxiliary electrode 6. In this graph, the horizontal axis indicates a clearance with a human body (distance from the human body) and vertical axis indicates the change in capacitance $\Delta C$. This calculation was conducted by using a metal plate with a predetermined area in place of an actual human body and the distance of the plate relative to the sensor electrode 5 was changed for calculation. The test conditions were as follows: the original capacitance Co of the sensor electrode 5 was Co=30 pF; coupled capacitance between the sensor electrode 5 and the auxiliary electrode 6 was Cc=3 pF; and the distance between the auxiliary electrode 6 and the sensor electrode 5 was 0.2 mm. FIG. 8 shows that the capacitance change $\Delta C$, when the clearance from the human body is changed, is more gradual when the auxiliary electrode 6 is used compared with the case without such auxiliary electrode 6 and that variations in the capacitance change $\Delta C$ when human body approaches can be reduced and further that the signal processing at the sensor detecting portion 11 is facilitated even at a large distance from the human body because of the relatively large capacitance change $\Delta C$ value.

Figure 9A:
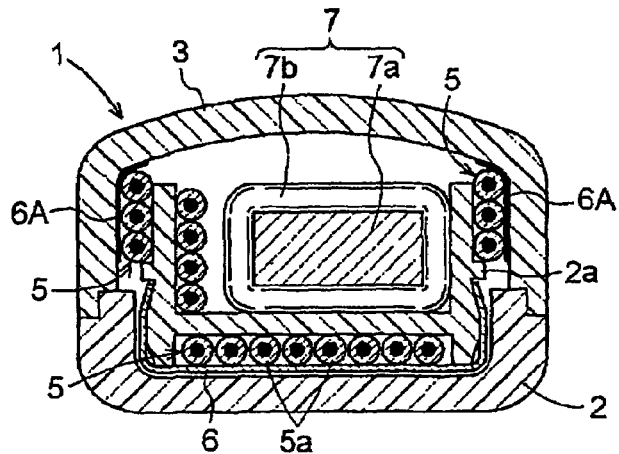
FIG. 9a and 9b show cross sections of the door handles installed with the human body detecting device according to other embodiments of the invention.
Figure 9B:
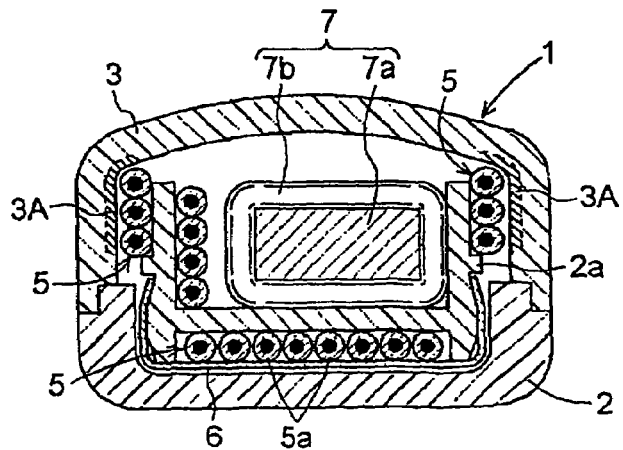

The present invention can be modified as follows: The auxiliary electrode 6 can be provided at a plurality of portions of the door handle or at various portions instead of providing on the core member 2a of the door handle 1. For example, as shown in FIG. 9a, an auxiliary electrode 6A may be provided at the inner periphery (inner wall of the handle 1) of the handle cover 3 opposing the part of the sensor electrode 5 provided closer to the outer surface side (e.g. near the top surface, shown as a right vertical wall in FIG. 9a, of the handle cover 3 and/or near the bottom surface, shown as a left vertical wall, of the handle cover 3) of the door handle 1. In this embodiment, it is preferable to form the auxiliary electrode 6A by applying conductive resin or conductive paint (coating) material to the inner periphery of the door handle cover 3 (i.e., inner wall of the handle). Another possibility is that as shown in FIG. 9b, the auxiliary electrode can be formed by a portion 3A made of conductive resin of the handle cover 3 at areas opposing the sensor electrode 5 provided closer to the outer surface side of the door handle 1. Further, it may be possible to position a plurality of auxiliary electrodes with various materials in the vicinity of the sensor electrode 5 provided near the side portion (i.e., the curved top surface in FIG. 9a) of the handle 1.

Further, the sensor electrode 5 may be extended outside of the door handle 1 and the auxiliary electrode can be exposed outside surface of the handle 1 covering over the upper portion of the sensor electrode 5.

The sensor electrode 5 is made by a single bent wire harness 5a in the above-described embodiment, but may be also formed by a conductive plate.

The principles, preferred embodiment and mode of operation of the present invention have been described in the foregoing specification. However, the invention, which is intended to be protected, is not to be construed as limited to the particular embodiments disclosed. Further, the embodiments described herein are to be regarded as illustrative rather than restrictive. Variations and changes may be made by other means or methods, and equivalents employed, without departing from the sprit of the present invention. Accordingly, it is expressly intended that all such variations, changes and equivalents that fall within the spirit and scope of the present invention as defined in the claims, be embraced thereby.

INDUSTRIAL APPLICABILITY

The present invention is directed to a useful and new device applicable in automotive industry as a human body detection device adapted to be provided inside a door handle.

The invention claimed is:

1. A human body detecting device for a vehicle comprising:
a sensor electrode provided in a door handle arranged on outside of a vehicle door, the sensor electrode changing an electrostatic capacitance in response to an approach of a human body,
a determining circuit signally connected to the sensor electrode for determining an approach of a human body based on the change of the electrostatic capacitance of the sensor electrode, and
an auxiliary electrode, that is coupled capacitance-wise with the sensor electrode, provided within the door handle,
wherein the auxiliary electrode is provided to a core member of the door handle,
wherein the core member has a generally H-shaped cross section with two generally parallel leg portions and a cross member connecting the two leg portions, and
wherein the sensor electrode and the auxiliary electrode are located on a side of the cross member facing the door outer panel.

2. A human body detecting device for a vehicle according to claim 1, wherein the sensor electrode is positioned opposite an outer panel of the vehicle door and the auxiliary electrode is positioned between the sensor electrode and the outer panel of the vehicle door.

3. A human body detecting device for a vehicle according to claim 1, wherein the auxiliary electrode is provided at a plurality of locations in the door handle.

4. A human body detecting device for a vehicle according to claim 1, wherein the auxiliary electrode is formed by a conductive plate.

5. A human body detecting device for a vehicle according to claim 4, wherein the auxiliary electrode is formed by the conductive plate of a long sheet shape with a bracket-shaped cross section.

6. A human body detecting device for a vehicle according to claim 1 wherein the auxiliary electrode is formed by a conductive resin.

7. A human body detecting device for a vehicle according to claim 6, wherein a portion of a cover of the door handle opposing the sensor electrode is formed by the conductive resin.

8. A human body detecting device for a vehicle according to claim 1 wherein the auxiliary electrode is formed by a conductive paint.

9. A human body detecting device for a vehicle according to claim 8 wherein the conductive paint is applied to an inner wall of the door handle.

10. A human body detecting device for a vehicle comprising:
a door handle arranged outside of a vehicle door,
a conductive sensor electrode provided inside of the door handle, and
a flat plate auxiliary electrode disposed between the sensor electrode and the vehicle door and positioned inside of the door handle, wherein the flat plate auxiliary electrode is coupled capacitance-wise with the sensor electrode and wherein a human body is detected by a change of an electrostatic capacitance between the sensor electrode and the vehicle door,
wherein the auxiliary electrode is provided to a core member of the door handle, and
wherein the core member has a generally H-shaped cross section with two generally parallel leg portions and a cross member connecting the two leg portions, and
wherein the sensor electrode and the auxiliary electrode are located on a side of the cross member facing the door outer panel.

11. A human body detecting device for a vehicle according to claim 10, wherein the auxiliary electrode is provided at a plurality of locations in the door handle.

12. A human body detecting device for a vehicle according to claim 10, wherein the auxiliary electrode is formed by a conductive plate.

13. A human body detecting device for a vehicle according to claim 10, wherein
the auxiliary electrode is formed by the conductive plate of a long sheet shape with a bracket-shaped cross section.

14. A human body detecting device for a vehicle according to claim 10 wherein the auxiliary electrode is formed by a conductive resin.

15. A human body detecting device for a vehicle according to claim 14, wherein a portion of a cover of the door handle opposing the sensor electrode is formed by the conductive resin.

16. A human body detecting device for a vehicle according to claim 10 wherein the auxiliary electrode is formed by a conductive paint.

17. A human body detecting device for a vehicle according to claim 16 wherein the conductive paint is applied to an inner wall of the door handle.

18. A human body detecting device for a vehicle according to claim 1, wherein an approach of a human body is determined based on an electrostatic capacitance between the sensor electrode and the vehicle door, an electrostatic capacitance between the sensor electrode and the auxiliary electrode, and an electrostatic capacitance between the auxiliary electrode and the human body.

19. A human body detecting device for a vehicle according to claim 10, wherein an approach of a human body is determined based on the electrostatic capacitance between the sensor electrode and the vehicle door, an electrostatic capacitance between the sensor electrode and the auxiliary electrode, and an electrostatic capacitance between the auxiliary electrode and the human body.

* * * * *